United States Patent [19]
Nobutoki

[11] Patent Number: 5,694,343
[45] Date of Patent: Dec. 2, 1997

[54] SYSTEM FOR SIMULATING PROPERTIES OF A MATERIAL HAVING PERIODICALLY REPEATED STRUCTURE

[75] Inventor: Hideharu Nobutoki, Amagasaki, Japan

[73] Assignee: Mitsubishi Denki Kabushiki Kaisha, Tokyo, Japan

[21] Appl. No.: 151,750

[22] Filed: Nov. 15, 1993

[30] Foreign Application Priority Data

Jul. 9, 1993 [JP] Japan ................................. 5-170413

[51] Int. Cl.$^6$ ....................................................... G06G 7/48
[52] U.S. Cl. ..................... 364/578; 364/488; 364/468.28; 364/468.03; 364/571.02; 395/24; 395/919; 395/920
[58] Field of Search .................................. 364/488, 489, 364/578, 468.02, 468.03, 512, 736, 472, 974, 20, 474.17, 474.16, 474.24, 554, 498, 571.01, 571.02, 570; 395/500, 600, 800, 51, 900, 61, 76, 3, 75, 50, 54, 435, 20, 919–922, 63, 68, 615, 22, 11, 66, 23; 257/15, 25

[56] References Cited

U.S. PATENT DOCUMENTS

| | | | |
|---|---|---|---|
| 4,720,642 | 1/1988 | Marks | 307/150 |
| 4,763,282 | 8/1988 | Rosenberg | 364/524 |
| 4,962,410 | 10/1990 | Kriman et al. | 357/22 |
| 5,084,232 | 1/1992 | Wong | 376/277 |
| 5,233,205 | 8/1993 | Usagawa et al. | 257/23 |
| 5,280,182 | 1/1994 | Waho | 257/25 |
| 5,328,556 | 7/1994 | Matlow | 156/643 |

OTHER PUBLICATIONS

"Quantum Chemistry Aided Design of Organic Polymers", Jean–Marie André et al., World Scientific Lecture and Course Notes in Chemistry–vol. 2, pp. 131 and 133 Jan. 1991.

"On the Need for Computing Derivatives of Energy Bands in Band Structure Calculations", J.M. André et al., Chemical Physics Letters, vol. 14, No. 4, 15 Jun. 1972, pp. 485–488.

*Primary Examiner*—Jacques Louis-Jacques

[57] ABSTRACT

A design system is provided for simulating and analyzing the properties of a periodically structured material such as a semiconductor or a superconductor to develop a novel periodically structured material. In the design system of the present invention, an overlap integral between Bloch functions, $\psi_m(k_A)$ and $\psi_l(k_B)$, for two adjacent wave number vectors, $k_A$ and $k_B$, in Brillouin zone is found as $S_{lm} = \langle \psi_l(k_B) | \psi_m(k_A) \rangle$ whereby a matching degree in terms of symmetrical nature of the Bloch functions, $\psi_m(k_A)$ and $\psi_l(k_B)$, can be quantitatively estimated. Accordingly, if the band array operation matrix, $$R_{mn} = \sum_i S_{im}^* S_{in},$$

is diagonalized to find an eigenvalue, $\gamma_p$ and an eigenvector, $U_{np}$, then there can be found from $\gamma_p$ and $U_{np}$ the Bloch functions in a one-to-one relation with two adjacent wave number vectors, $k_A$ and $k_B$:

$$\Psi_p(k_A) = \sum_m U_{mp} \Psi_m(k_A) \text{ and } \Psi_q(k_B) = \gamma_q^{-1/2} \sum_i \sum_m S_{im} U_{mp} \Psi_i(k_B)$$

such that energy bands are in one-to-one relation with each wave number vector.

3 Claims, 7 Drawing Sheets

WAVE NUMBER VECTOR k

SYSTEM FOR SIMULATING PROPERTIES OF A MATERIAL HAVING PERIODICALLY REPEATED STRUCTURE

BACKGROUND OF THE INVENTION

The present invention relates to a simulation method, a design system, a knowledge base, a knowledge base system and a development system which are employed in simulating and analyzing the properties of a material having periodically repeated structure (hereinafter referred to as a periodically structured material) composed of infinitely repeating unit cells, such as a semiconductor or a superconductor, and in developing such a material.

The term "unit cell" as used herein means a structural unit of a material, such as a crystal or a polymer, in which the same structure is periodically repeated.

Hitherto, in simulating or analyzing the properties of a periodically structured material, such as a crystal or a polymer constituting a semiconductor or a superconductor, where a unit cell is repeated infinitely, a Schrödinger equation for the periodically structured material cannot be solved as it stands and, hence, the Schrödinger equation is reduced to a secular equation for each wave number vector with use of period boundary condition of Born von Karman, followed by solving the secular equation to give the energy value and Bloch function for each wave number vector. In this case, it is difficult as a practical matter to give energy values and Bloch functions for all the wave number vectors in Brillouin zone since the computing therefor is too high a load for the computer. In practice, only a limited number of wave number vectors in Brillouin zone are calculated. The energy bands in Brillouin zone are obtained by interpolating in view of the relationship in magnitude among individual energy values gained from the limited number of wave number vectors and the symmetrical nature of the Bloch functions. From the thus obtained energy bands in Brillouin zone, the properties of the periodically structured material can be determined. For instance, if a certain periodically structured material shows energy bands as functions of wave number vector k which cross each other at point O as depicted in FIG. 7(a), this material has no band gap and hence, is a metal material. In contrast, if another periodically structured material has energy bands as depicted in FIG. 7(b) where the upper energy band which descends from a relatively high energy level draws a downwardly orienting apex at point A and the lower energy band which ascends from a relatively low energy level draws an upwardly orienting apex at point B, it shows that between points A and B there is a space H, which is a band gap, and hence, this material is a semiconductor or an insulator. Therefore, it is an important factor in simulating the properties of a periodically structured material whether the energy bands, which shows the relation between the wave number vector and the energy, cross each other in the central portion as shown in FIG. 7(a) or form a gap as shown in FIG. 7(b). Note that in FIGS. 7(a) and 7(b) a circled mark represents a calculated value and a line segment linking circled marks represents an energy band obtained by interpolation.

In the prior art method described above wherein the relation between the wave number vector and the energy in the central portion is found by interpolating calculated values about a plurality of wave number vectors thus simulating the properties of a periodically structured material, a difficultly is encountered. That is, when energy bands in the central portion of FIG. 8 are determined by interpolating energy values gained in the Brillouin zone shown for example, in FIG. 8, it is not easy to determine whether lines should be formed between the energy points at different wave numbers so that they cross as shown in FIG. 7(a) or not as shown in FIG. 7(b), even if the relationship of magnitude among energy values and the symmetrical nature of the Bloch function are taken into consideration. Moreover, such a determination is almost impossible if the subject periodically structured material has many energy bands or its energy bands are not very symmetric.

As described above, the prior art simulation method for a periodically structured material has a problem that energy bands in the Brillouin zone cannot be determined accurately by interpolating energy values obtained from a limited number of wave number vectors and, hence, the properties of the material cannot be simulated accurately.

SUMMARY OF THE INVENTION

It is an object of the present invention to provide a method for simulating properties of a periodically structured material which determines energy bands accurately and quantitatively while the prior art method have not been able to do, and which simulates and analyzes the properties of a periodically structured material, such as a crystal or a polymer which can be applied as a semiconductor or a superconductor.

A further object of the present invention is to provide a system for designing a periodically structured material with desired property values by specifying conditions and characteristics of the periodically structured material and by simulating and analyzing the property values of the material with use of a simulation device employing the aforesaid simulation method.

A still further object of the present invention is to provide a design knowledge base for a periodically structured material which constitutes a data base for property values given by the aforesaid simulation device of the periodically structured materials, files the knowledge concerning information and empirical rules about periodically structured materials, and infers therefrom the properties, reactivity or the like of another periodically structured material.

Another object of the present invention is to provide a design knowledge base system for a periodically structured material in which the aforesaid design system and design knowledge base are connected to each other through an interface to design a periodically structured material.

An additional object of the present invention is to provide a development system for a periodically structured material in which the aforesaid design knowledge base system is connected to preparation means and evaluation means through an interface to develop a periodically structured material.

The present invention provides a simulation method for simulating properties of a periodically structured material composed of unit cells repeated infinitely comprising the following steps:

(a) solving a Schrödinger equation for the periodically structured material with use of a period boundary condition of Born von Karman to find Bloch function and energy value of the periodically structured material for each wave number vector thereof;

(b) finding an overlap integral represented by $S_{im} = \langle \psi_i(k_B) | \psi_m(k_A) \rangle$ between two Bloch functions, $\psi_m(k_A)$ and $\psi_i(k_B)$, for two adjacent wave number vectors, $k_A$ and $k_B$;

(c) calculating a band array operation matrix:

$$R_{mn} = \sum_i S_{im} * S_{in};$$

(d) diagonalizing the band array operation matrix, $R_{mn}$; and (e) finding, from an eigenvalue, $\gamma_p$, and an eigenvector, $U_{np}$ which result from the diagonalization, Bloch functions in a one-to-one relation with the two adjacent wave number vectors, $k_A$ and $k_B$:

$$\Psi_p(k_A) = \sum_m U_{mp}\Psi_m(k_A) \text{ and } \Psi_q(k_B) = \gamma_q^{-1/2} \sum_i \sum_m S_{im}U_{mp}\Psi_i(k_B)$$

and energy bands in a one-to-one relation therewith.

Another aspect of the present invention provides a design system for designing a periodically structured material, comprising:

a simulation device for simulating property values of a periodically structured material comprising:

(a') means for solving a Schrödinger equation for the periodically structured material with use of a period boundary condition of Born von Karman to find a Bloch function and energy values of the periodically structured material for each wave number vector thereof;

(b') means for finding an overlap integral, $S_{im}=<\psi_i(k_B)|\psi_m(k_A)>$, between two Bloch functions, $\psi_m(k_A)$ and $\psi_i(k_B)$, for two adjacent wave number vectors, $k_A$ and $k_B$;

(c') means for calculating a band array operation matrix:

$$R_{mn} = \sum_i S_{im} * S_{in};$$

(d') means for diagonalizing the band array operation matrix, $R_{mn}$; and (e') means for finding, from an eigenvalue, $\gamma_p$, and an eigenvector, $U_{np}$ which result from the diagonalization, Bloch functions in a one-to-one relation with the two adjacent wave number vectors, $k_A$ and $k_B$:

$$\Psi_p(k_A) = \sum_m U_{mp}\Psi_m(k_A) \text{ and } \Psi_q(k_B) = \gamma_q^{-1/2} \sum_i \sum_m S_{im}U_{mp}\Psi_i(k_B)$$

and energy bands in a one-to-one relation therewith, input means for inputting conditions and characteristics of the periodically structured material, a display device for displaying data existing in the input means or in the simulation device, and control means for controlling data transfer among the input means, the simulation device and the display device.

Another aspect of the present invention provides a design knowledge base for a periodically structured material, comprising the aforesaid simulation device, a data base for storing data output from the simulation device, a knowledge base for storing information on the periodically structured material, and an inference system for inferring properties of the periodically structured material on the basis of data from the data base and from the knowledge base.

Another aspect of the present invention provides a design knowledge base system for a periodically structured material, comprising the aforesaid design system, the aforesaid design knowledge base, and an interface through which the design system and the design knowledge base are connected to each other.

Another aspect of the present invention yet provides a development system for periodically structured material, comprising means for preparing a periodically structured material, evaluation means for evaluating the periodically structured material, the aforesaid design knowledge base system, and an interface through which the design knowledge base system is connected to the preparation means and to the evaluation means.

According to the simulation method of the present invention, the overlap integral between the Bloch functions, $\psi_m(k_A)$ and $\psi_i(k_B)$, for two adjacent wave number vectors, $k_A$ and $k_B$, in Brillouin zone is found as $S_{im}=<\psi_i(k_B)|\psi_m(k_A)>$ whereby a matching degree in terms of symmetric property between the Bloch functions, $\psi_m(k_A)$ and $\psi_i(k_B)$, can be quantitatively estimated. Accordingly, if the band array operation matrix, $$R_{mn} = \sum_i S_{im} * S_{in},$$

is diagonalized to find the eigenvalue, $\gamma_p$ and eigenvector, $U_{np}$, then there can be found from $\gamma_p$ and $U_{np}$ the Bloch functions in a one-to-one relation with the two adjacent wave number vectors, $k_A$ and $k_B(<\psi_q(k_B)|\psi_p(k_A)>=\gamma_q^{1/2}\delta_{qp}$, where $\delta$ is Konecker's delta):

$$\Psi_p(k_A) = \sum_m U_{mp}\Psi_m(k_A) \text{ and } \Psi_q(k_B) = \gamma_q^{-1/2} \sum_i \sum_m S_{im}U_{mp}\Psi_i(k_B)$$

and energy bands in a one-to-one relation therewith. Further, since a a normalized orthogonlity ($<\psi_p(k_A)|\psi_r(k_A)>=\delta_{pr}$, $<\psi_q(k_B)|\psi_s(k_B)>=\delta_{qs}$) holds between the thus obtained Bloch functions for the wave number vectors, $k_A$ and $k_B$, the flow of electrons or holes in each energy band can be traced thereby thereby allowing simulation and analysis of the properties of the target periodically structured material.

According to the design system of the present invention, conditions and characteristics of a periodically structured material are inputted through the input means, the properties of the periodicily structured material are simulated on the basis of the data thus inputted, and the properties simulated are displayed, whereby the properties of the periodically structured material can be simulated and analyzed in detail with ease.

According to the design kowledge base of the present invention, property values of a periodically structured material which are given by the simulation device are incorporated into a data base, while knowledge such as general information or empiricical rules is filed, whereby the properties such as band gaps of another periodically structured material can be inferred from the property values simulated on the basis of the conditions and characteristics of the material thereby simulating and analyzing the properties of any periodicily structured material in more detail.

According to the design knowledge base system of the present invention, the aforesaid design system and design knowledge base are interconnected through the interface, whereby the material design conditions inputted enables the properties of another material to be theoretically calculated, the results inferred from the properties thus calculated can be fed back to the design system, and thereby the properties of any periodically structured material can be simulated and analyzed in more detail.

According to the development system of the present invention, the preparation means, the evaluation means, and the aforesaid design knowledge base system are interconnected through the interface, whereby the properties of a periodically structured material can be theoretically calculated with ease, the material of the properties thus calculated can be prepared and evaluated, further the data from the evaluation can be fed back to the design system, and thereby any periodically structured material can be developed efficiently and analyzed in more detail.

BRIEF DESCRIPTION OF THE DRAWINGS

FIGS. 2(a) and 2(b) in general show examples of the properties of trans-polyacetylene which are found by the simulation method of the present invention; in which FIG. 2(a) is a diagrammatic representation showing energy bands relative to wave number vector, and FIG. 2(b) is also a diagrammatic representation showing the number of active electrons in each energy band relative to wave number vector;

DETAILED DESCRIPTION

The present invention will now be described in detail by way of specific examples.

Figure 1:
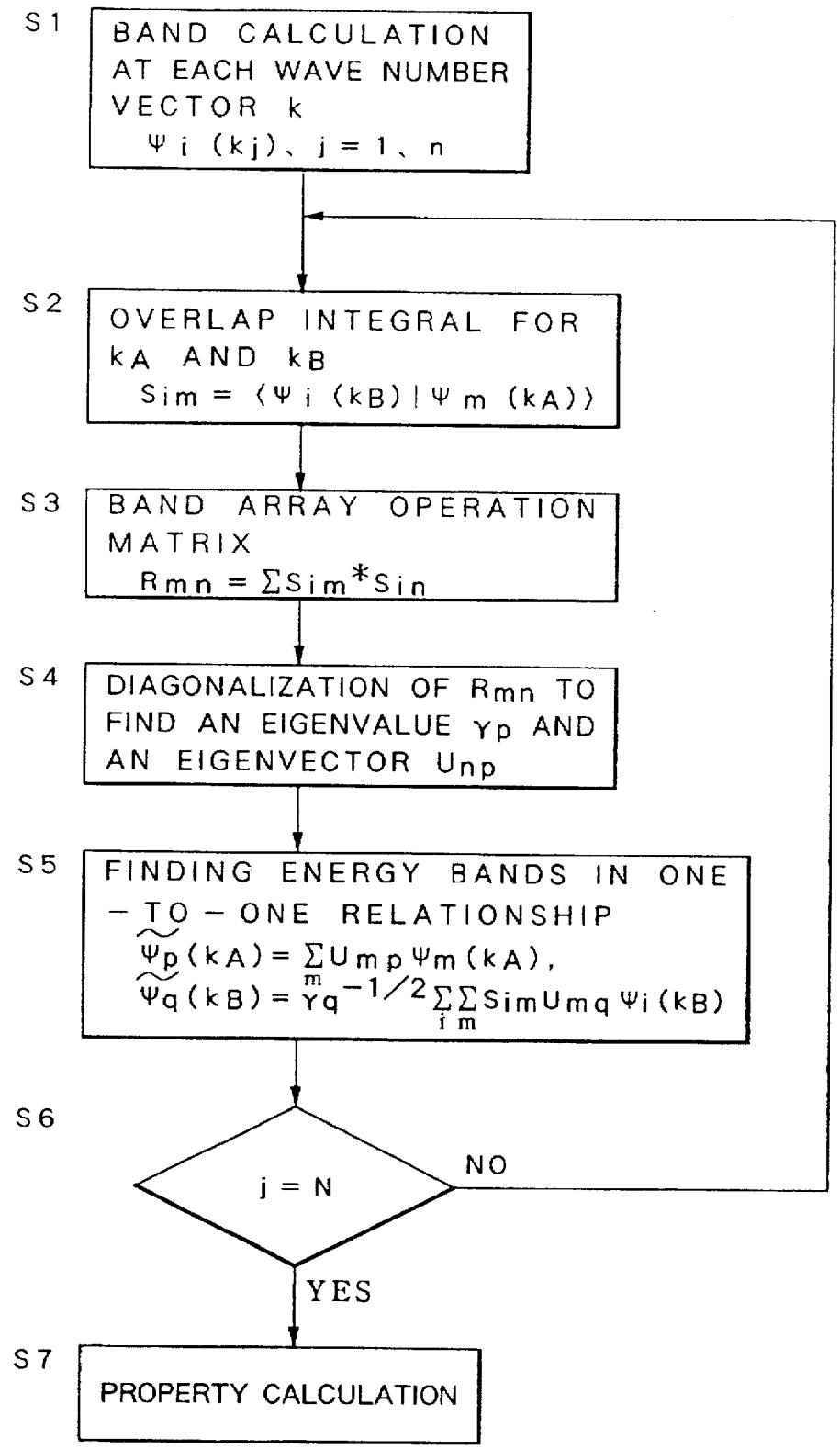
FIG. 1 is a flowchart of one embodiment of a method for simulating periodically structured material according to the present invention.

As shown in the flowchart of FIG. 1, a simulation method according to the present invention for simulating the properties of a periodically structured material composed of unit cells repeated infinitely is characterized by: (S1) solving a Schrödinger equation for the periodically structured material with use of a periodic boundary condition of Born von Karman to find Bloch functions and energy values of the periodically structured material for each wave number vector thereof; (S2) finding an overlap integral represented by $S_{im} = <\psi_i(k_B)|\psi_m(k_A)>$ between two Bloch functions, $\psi_m(k_A)$ and $\psi_i(k_B)$, for two adjacent wave number vectors, $k_A$ and $k_B$; (S3) calculating a band array operation matrix, $$R_{mn} = \sum_i S_{im}^* S_{in}$$

where $S_{im}^*$ is a complex conjugate of $S_{im}$; (S4) diagonalizing the band array operation matrix, $R_{mn}$; and (S5) finding, from an eigenvalue, $\gamma_p$, and an eigenvector, $U_{np}$ which result from the diagonalization, Bloch functions in a one-to-one relation with the two adjacent wave number vectors, $k_A$ and $k_B$:

$$\Psi_p(k_A) = \sum_m U_{mp}\Psi_m(k_A) \text{ and } \Psi_q(k_B) = \gamma_q^{-1/2} \sum_i \sum_m S_{im} U_{mp} \Psi_i(k_B)$$

energy bands in a one-to-one relation therewith. By (S6) performing a series of these calculations for each of the predetermined number (N) of wave number vectors, the properties of the subject material are simulated and analyzed (S7).

In the prior art, Bloch functions and energy value for each wave number vector are found by calculations, and then the properties of a subject material are simulated by interpolating to determine energy bands or a like characteristic. This resets in inaccurate property simulation particularly in case where the Bloch functions exhibit poor symmetry or my energy bands exist. In the present invention, however, after calculating, for each wave number vector, an overlap integral between Bloch functions for two adjacent wave number vectors is found, and then Bloch functions and energy bands in one-to-one relation with the two adjacent wave number vectors are found. Hence, when energy bands are interpolated in accordance as energy levels for individual wave number vectors with the symmetry of the Bloch functions taken into consideration, an energy value not calculated but found by the interpolation for any wave number vector is very accurate and, thereby, the properties of the periodicily structured material be simulated with accuracy.

In the simulation method of the present invention the potential of one active electron and Bloch function in the Schrödinger equation used are not limited as far as they satisfy the aforesaid requirements and they can be used in any and calculation method. A method is desirable for accurate simulation of energy bands which positively takes an overlap integral between atoms constituting a periodically structured material into consideration.

The simulation method, the design system, the design knowledge base, the design knowledge base system and the development system according to the present invention will be described by way of the following examples which are not limitative of the present invention.

EXAMPLE 1

Figure 2A:
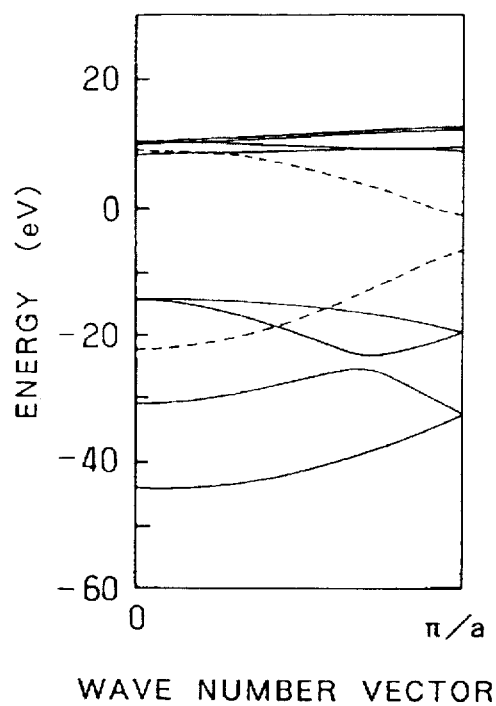
Figure 2B:
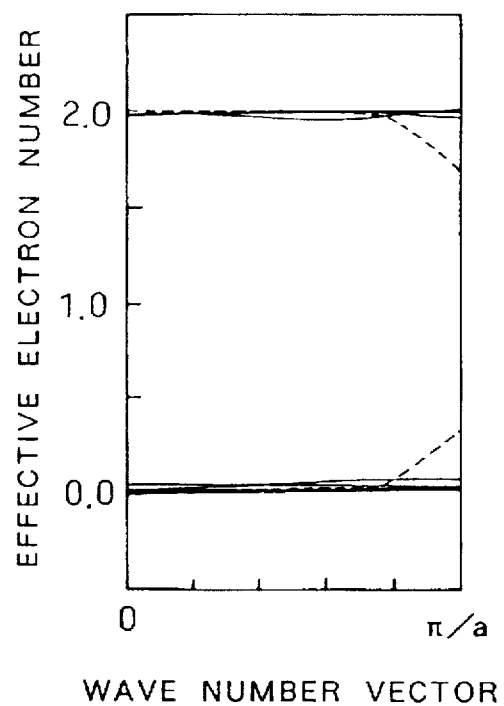

In this Example the property simulation method of the present invention is applied trans-polyacetylene, to which the present invention is, of course, not limited. FIG. 2(a) is a diagrammatic representation of energy bands of trans-polyacetylene which are calculated according to the method of the present Example, and FIG. 2(b) shows the number of effective electrons in each energy band. In FIGS. 2(a) and 2(b) the horizontal axis represents wave number vector from 0 to π/a in Brillouin zone, where a is the length (lattice constant) of a translational vector of a unit cell. In FIG. 2(a) the vertical axis represents energy value of energy bands, while in FIG. 2(b) the vertical axis represents the number of electrons occupying each energy band, namely the number of active electrons. In FIGS. 2(a) and 2(b) the energy bands and the number of electrons are found by calculating at about ten wave number vectors for each energy band and by interpolating.

The energy band plotted in the broken lines in FIG. 2(a) is the π band, and the number of active electrons plotted in dotted line in FIG. 2(b) corresponds to the π band. In the calculations of the method of the present Example, the potential of one active electron in Schrödinger equation is found by extended Hückel approximation, and the Bloch function is determined by a band calculation method based on linear combination of atomic orbitals. Since the extended Hückel approximation considers valence electrons only, ten bands appear in FIG. 2(a), the number of which is the sum of outer shell atomic orbitals constituting a unit cell of trans-polyacetylene. The band structure shown in FIG. 2(a) is in very good correspondence with the result calculated taking the symmetrical nature of the Bloch functions into strict consideration In FIG. 2(b), the number of active electrons of the π band, which is plotted in dotted line, is conspicuously changed. This is also in exact correspondence with such a result from experiments that the conductivity of trans-polyacetylene greatly depends on the π band. More specifically, the closer wave number vector k comes to π/a, the closer the number of active electrons of the π band gets to 1 from 0 and from 2 (refer to the broken lines in FIG. 2(b)). This indicates that exchange of electrons occurs and the π band shows the conductivity. In the prior art simulation method such a change in the number of electrons does not appear and the number of electrons remains separated at 0 and 2. Hence, it is impossible to determine what responsible for the conductivity.

With reference to FIGS. 1, 2(a) and 2(b) the operation of Example 1 will be explained. In simulating energy bands as shown in FIGS. 2(a) and 2(b), the step (S1) for solving Schrödinger equation with use of the period boundary condition of Born von Karman to find an energy value for each wave number vector is the same as in the prior art simulation method. The step (S2) follows to find an overlap integral represented by $S_{im} = <\psi_i(k_B)|\psi_m(k_A)>$ between two Bloch functions, $\psi_m(k_A)$ and $\psi_i(k_B)$, for two adjacent wave number vectors, $k_A$ and $k_B$. The step (S3) is then performed with use of the overlap integral, $S_{im}$, to calculate a band array operation matrix, $$R_{mn} = \sum_i S_{im}^* S_{in}.$$

The step (S4) follows to diagonalize the d array operation matrix, $R_{mn}$, to find an eigenvalue, $\gamma_p$, and an eigenvector, $U_{np}$. The next step (S5) is to find Bloch functions in a one-to-one relation with the two adjacent wave number vectors, $k_A$ and $k_B$:

$$\Psi_p(k_A) = \sum_m U_{mp}\Psi_m(k_A) \text{ and } \Psi_q(k_B) = \gamma_q^{-1/2} \sum_i \sum_m S_{im}U_{mp}\Psi_i(k_B)$$

and energy bands in a one-to-one relation therewith. The step (S6) is a repeat of the calculation for each of a predetermined number, for example 10, of wave number vectors in Brillouin zone to find one energy band. Finally, in the step (S7) the properties of the subject material are calculated using the thus found Bloch functions in a one-to-one relation with the wave number vectors, $k_A$ and $k_B$. As a result, ten energy bands are found for each wave number vector as shown in FIG. 2(a), and from FIG. 2(b) showing the number of active electrons of each energy band found from such Bloch functions, π band (plotted in the broken lines in FIG. 2(b)) is found to be responsible for the conductivity of the subject material.

EXAMPLE 2

Figure 3:
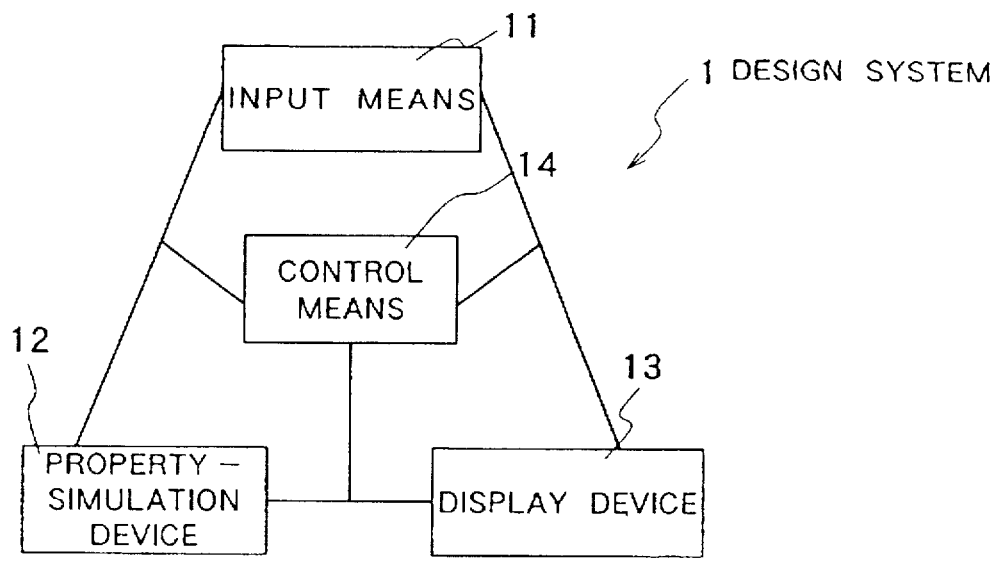
FIG. 3 is a block diagram of one example of a design system for a periodically structured material according to the present invention.

FIG. 3 shows a block diagram embodying a design system of the present invention for designing a periodically structured material with use of a property-simulation device. As a matter of course the design system of the present invention is not limited to the design system 1 shown in FIG. 3. In this figure an input means 11 has a function of inputting and modifying the structure of a periodically structured material on a display. The property-simulation device 12 comprises various calculation means for simulating the properties of the periodically structured material. The calculation means include, for example, means for solving Schrödinger equation with use of the period boundary condition of Born von Karman to find a Bloch function and an energy value for each wave number vector, means for finding an overlap integral represented by $S_{im} = <\psi_i(k_B)|\psi_m(k_A)>$ between two Bloch functions, $\psi_m(k_A)$ and $\psi_i(k_B)$, for two adjacent wave number vectors, $k_A$ and $k_B$, means for calculating a band array operation matrix, $$R_{mn} = \sum_i S_{im}^* S_{in},$$

means for diagonalizing the band array operation matrix, $R_{mn}$, and means for finding, from an eigenvalue, $\gamma_p$, and an eigenvector, $U_{np}$, which result from the diagonalization, Bloch functions in a one-to-one relation with the two adjacent wave number vectors, $k_A$ and $k_B$:

$$\Psi_p(k_A) = \sum_m U_{mp}\Psi_m(k_A) \text{ and } \Psi_q(k_B) = \gamma_q^{-1/2} \sum_i \sum_m S_{im}U_{mp}\Psi_i(k_B)$$

and energy bands in a one-to-one relation therewith. A display device 13 graphically shows various property values resulting from the calculations by the property-simulation device 12. A control means 14 controls so as to assure smooth flows among the input means 11, the property-simulation device 12 and display device 13. The input data, in the input means 11, for the property-simulation device 12 is checked for an input error with the memory data of a computer or the like. If there is any input error, the control means 14 makes the display device 13 indicate the input means on its display to alter the input data for the property-simulation device 12. The control means 14 also makes the display device 13 show sequentially the state of the calculations in the property-simulation device 12 or the state of the computer in use.

An example which is applied to trans-polyacetylene is described in the following, but the present invention is, of course, not limited to this example.

First, with the input means 11 comprised of a keyboard or the like, the formula of a unit cell of trans-polyacetylene is shown on the display and further inputs control keywords, such as calculation time, for the property-simulation device 12. Then, the control means 14 automatically recognizes it as the input data for the property-simulation device 12 so that the

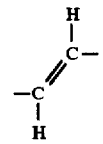

property-simulation device 12 calculates. During the calculations at the property-simulation device 12 the control means 14 makes the display device 13 sequentially show on its display the state of the calculations or the state of the computer in use. If the calculations do not converge but diverge, the control means 14 makes the display device 13 show on its display the cause of the divergence and a message requesting another input from the input means 11. The result (FIG. 2) of calculations is shown on the display device 13 through the control means and may be altered in size and color of its graphic

EXAMPLE 3

Figure 4:
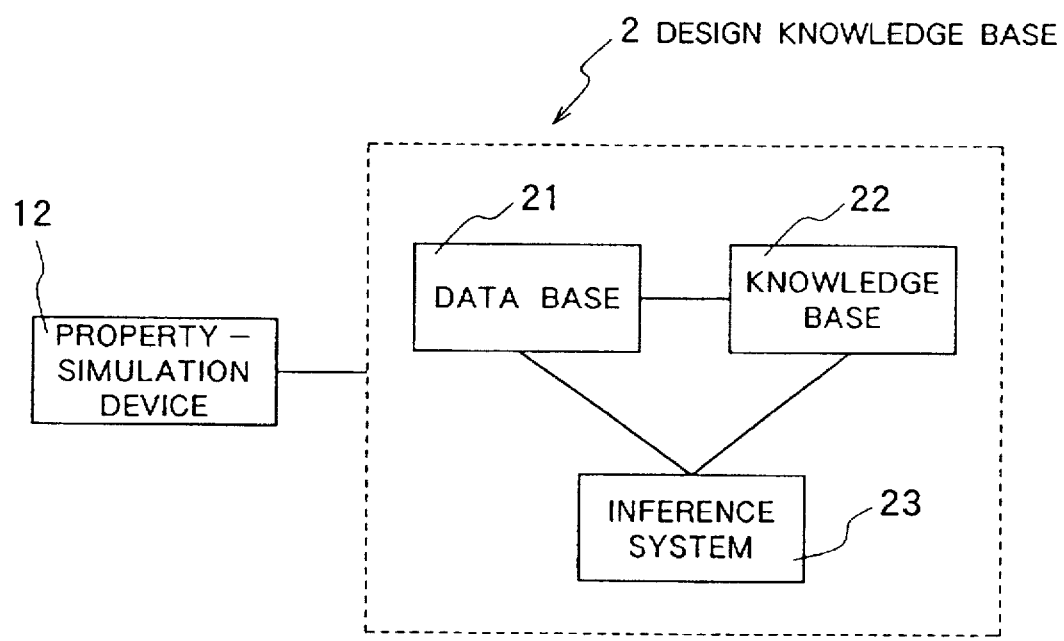
FIG. 4 is a block diagram of one example of a design knowledge base for a periodically structured material according to the present invention.

FIG. 4 is a block diagram of one example of a design knowledge base according to the present invention which is capable of incorporating property values obtained by the property simulation device into a data base while filing knowledge such as information and empirical rules on periodically structured materials whereby the properties or reactivity of another periodically structured material can be inferred from the data thus stored. The design knowledge base of the present invention is, of course, not limited to a design knowledge base 2 shown in FIG. 4. In this figure a property-simulation device 12 comprises various calculation means for simulating the properties of a periodically structured material. A data base 21 includes files of various property values calculated at the property-simulation device 12 and of data on periodically structured materials, while a knowledge base 22 includes files of information and empirical rules on the periodically structured materials. An inference system 23 includes means for leading the user to issue requests with use of, for example, the data and knowledge in the data base and knowledge base, control means for performing control in analyzing and understanding the response from the user to obtain the results of inference, and like means, thereby inferring the properties, reactivity and the like of a subject periodically structured material.

The data to be stored in the data base 21 includes names of periodically structured materials, their structural formulae, general standard properties such as density, melting point and glass transition point, standard functional properties such as electro-magnetic properties and optical properties, standard practical properties such as strength and stability, charts such as energy band diagram and phase diagram, keywords, and the like.

The files of the knowledge base 22 accommodate fields related to the contents of information, names of items, outlines of items, problems, name and location of associated data base, keywords for retrieval, and the like.

Figure 5:
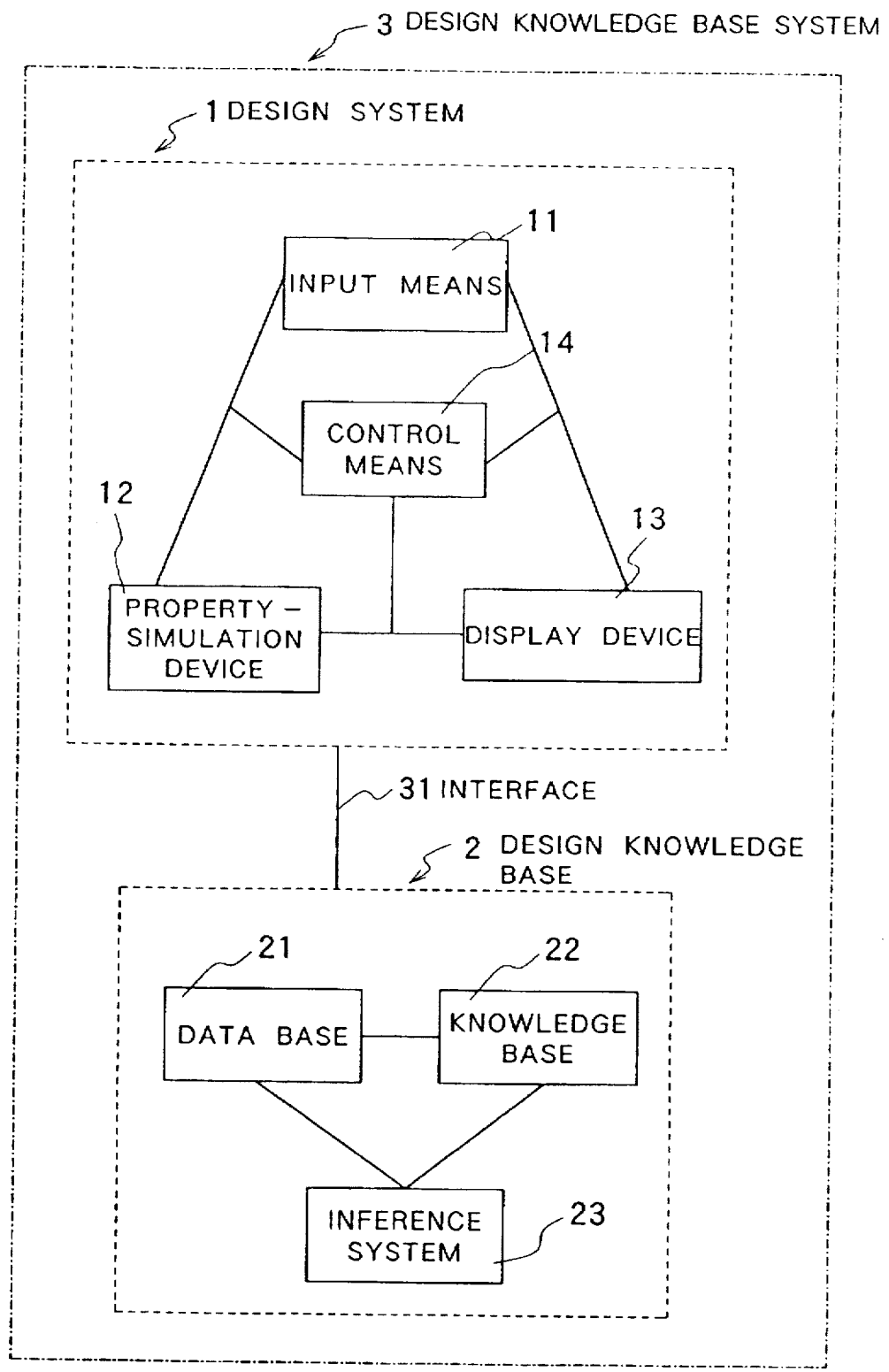
FIG. 5 is a block diagram of one example of a design knowledge base system for a periodically structured material according to the present invention.

The inference system 23 is comprised of a structure inference system, a property inference system, a synthesizing method inference system, a compounding method inference system and the like, each of which includes the aforesaid leading means, control means and the like. As shown in FIG. 5, the calculations at the design system are sent to the design knowledge base thereby allowing the building of data base and knowledge base and making the inference of property values possible.

An example which is applied to trans-polyacetylene is described the following but the present invention is, of course, not limited to this example. The calculations for trans-polyacetylene (FIG. 2), obtained from the property-simulation device 12, are fed to the data base 21 and incorporated into a data base. Such data may be compared with, for example, a value calculated using, for example, the empirical equation: $\Delta E_g$=(constant of proportionality)× (distance between carbon atoms), which estimates a band gap $\Delta E_g$ based on the distance between carbon atoms and which is stored in the knowledge base 22. Further, from the band gap calculated by the property-simulation device 12 and stored in the data base 21 and that calculated using the empirical equation stored in the knowledge base 22, the band gap of another periodically structured material can be inferred by the inference system 23.

EXAMPLE 4

FIG. 5 shows a block diagram of one example of a design knowledge base system according to the present invention which is, of course, not limitative of the present invention. The design knowledge base system shown in FIG. 5 comprises the design system 1 shown in FIG. 3, the design knowledge base 2 shown in FIG. 4, and an interface 31 interconnecting these components. As shown in FIG. 5, the calculations at the design system 1 are sent to the design knowledge base 2, and are incorporated into the data base and the knowledge base to infer property values and to be shown on the display device 13 if desired. Reversely, the data from the data base 21, knowledge base 22 or inference system 23 are fed back to the design system 1 thereby making the design of another periodically structured material efficient.

An example which is applied to trans-polyacetylene is described in the following, but the present invention is, of course, not limited to this example. When the data of trans-polyacetylene are inputted on the display by the input means, the control means 14 makes the data base 21 retrieve the structure of trans-polyacetylene, which is, in turn, shown on the display of the display device 13, and checked if the data being displayed is appropriate as data to be input to the property-simulation device 12. When the structure needs to be modified, it is modified using the functions of the display device 13, on the other hand when the modification of the structure is unnecessary, the control means 14 automatically recognizes it as the input data for the property-simulation device 12 upon entry of a control key word, such as calculation time, for the property-simulation device 12 and makes the property-simulation device 12 calculate. The calculation state and the state of the computer in use are sequentially shown on the display of the display device 12 through the control means 14. At this time, if the calculations do not converge but diverge, the control means 14 makes the display device 13 show the cause on its display and indicate another input from the input means 11. The calculations (FIG. 2) are displayed on the display of the display device 13 through the control means 14 and may be altered in size and color of its graphic form. The calculations (FIG. 2), obtained from the property-simulation device data base 21 and trans-polyacetylene is fed to the data base 21 and incorporated into the data base. Such data may be compared with, for example, a value calculated using, for example, the empirical equation: $\Delta E_g$=(constant of proportionality)× (distance between carbon atoms), which estimates a band gap $\Delta E_g$ based on the distance between carbon atoms and which is stored in the knowledge base 22. Further, from the band gap calculated on the property-simulation device 12 and stored in the data base 21 and that calculated using the empirical equation stored in the knowledge base 22, the band gap of another periodically structured material can be inferred by the inference system 23. The results of the inference are displayed on the display device 13 through the control means 14.

EXAMPLE 5

Figure 6:
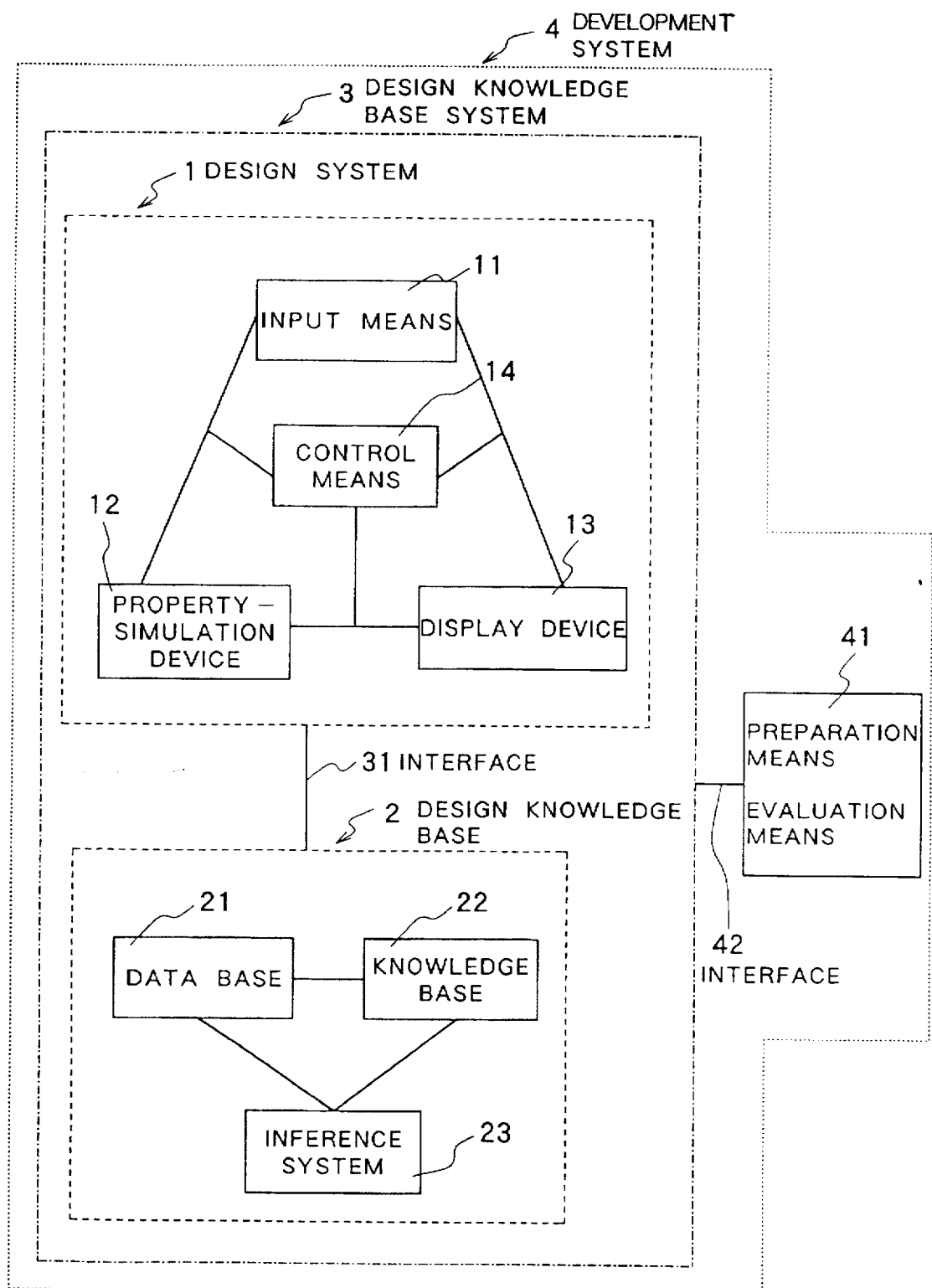
FIG. 6 is a block diagram of one example of a development system for a periodically structured material according to the present invention.
Figure 7A:
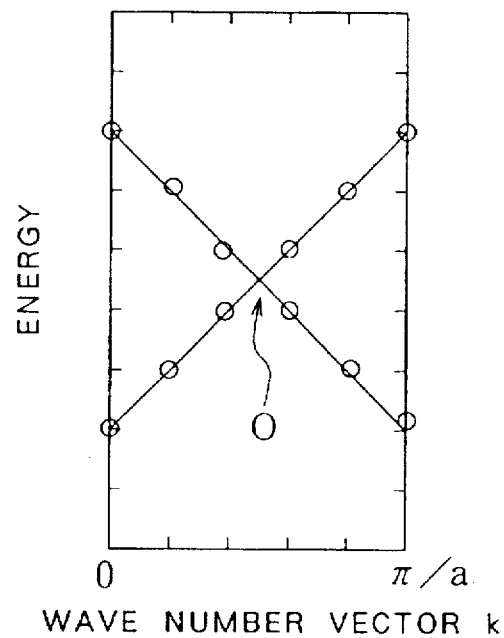
FIGS. 7(a) and 7(b) are schematic representations showing energy bands of different periodically structured materials.
Figure 7B:
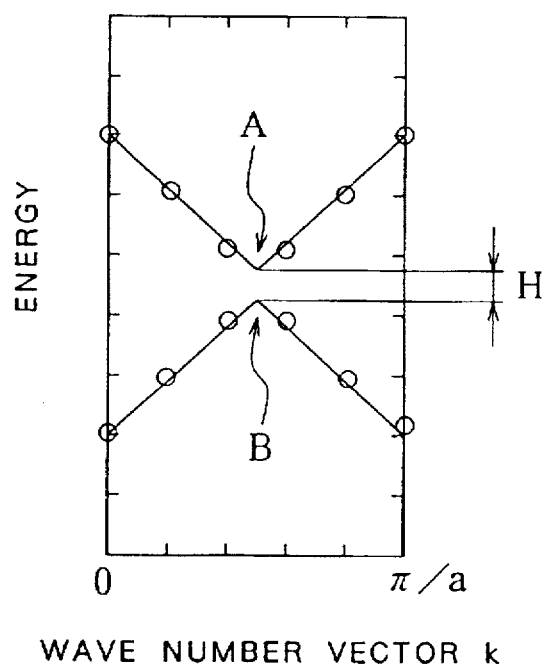
Figure 8:
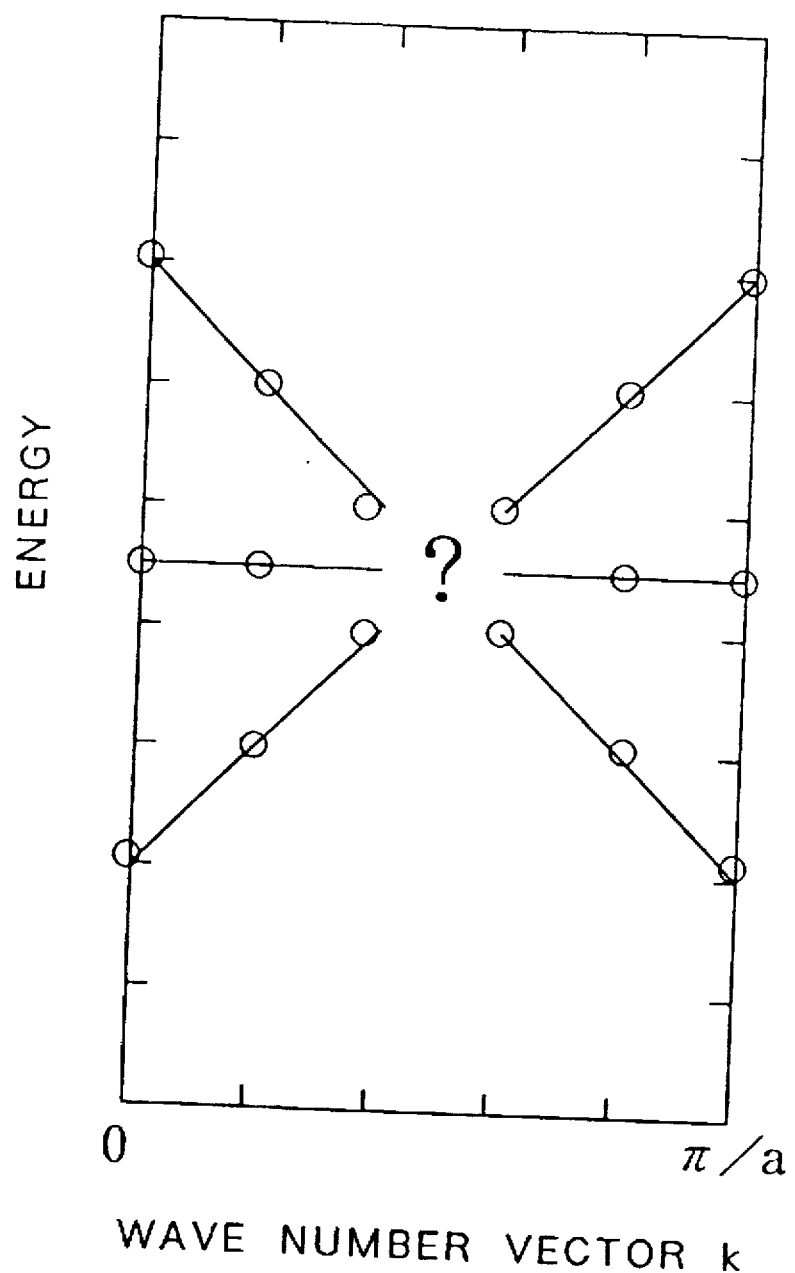
FIG. 8 is also a schematic representation showing energy bands of another periodically structured material.

FIG. 6 shows a block diagram of one example of a development system for a periodically structured material according to the present invention, but the development system of the present invention is, of course, not limited to this example. The development system shown in FIG. 6 comprises the design knowledge base system 3 shown in FIG. 5, preparation means and evaluation means 41. The preparation means is based on a chemical preparation method such as organic or inorganic synthesis, a physical preparation method such as photopolymerization or plasma polymerization, an electrochemical preparation method such as electrolytic polymerization, or a like method. However, any method for preparing a periodically structured material is usable without any particular limitation. The evaluation means is based on a visible and ultraviolet absorption spectrometry, infrared absorption spectrometry, Raman spectroscopy, atomic absorption spectroscopy, frame spectrometry, emission spectrometry, polarimetry, circular dichroism analysis, X-ray analysis, electron spectroscopy, nuclear magnetic resonance absorption spectrometry, paramagnetic resonance absorption spectrometry, mass spectrometry, potentiometry, electrolytic analysis, coulometric analysis, conductimetry, high-frequency analysis, gas chromatography, high speed liquid chromatography, thermal analysis, radimetric analysis, or a like method. However, any means for evaluating a periodically structured material is usable without any particular limitation. In FIG. 6 the design knowledge base system designs an ideal periodically structured material, based on which the preparation means actually prepares such a periodically structured material, and the evaluation means evaluates the periodically structured material thus prepared as well as the preparation process. By feeding back the evaluation results by the evaluation means to the design knowledge base system, it becomes possible to design a periodically structured material with higher accuracy, to efficiently prepare the target periodically structured material again with the preparation means, and to evaluate the same.

An example which is applied to trans-polyacetylene is described in the following, but the present invention is, of course, not limited to this example. When the data of trans-polyacetylene is input on the display by the input means 11, the control means 14 makes the data base 21 retrieve the structure of trans-polyacetylene which is, in turn, shown on the display device 13, and then checked if the data being displayed is appropriate as data to be input to the property-simulation device 12. If the displayed structure needs to be modified, it is modified using the functions of the display device 13, while if modification of the structure is unnecessary, the control means 14 automatically recognizes it as the input data for the property-simulation device 12 in response to the entry of a control keyword, such as calculation time, for the property-simulation device 12 and makes the property-simulation device 12 calculate. The calculation state and the state of the computer in use are sequentially shown on the display of the display device 12 through the control means 14. If the calculations do not converge but diverge, the control means 14 makes the display device 13 show the cause on its display and indicate another input from the input means 11. The calculations (FIG. 2) are shown on the display of the display device 13 through the control means 14 and may be altered in size and color of its graphic form. The calculations (FIG. 2), obtained from the property-simulation device 12 for trans-polyacetylene are fed to the data base 21 and incorporated into the data base. Such data may be compared with, for example, a value calculated using, for example, the empirical equation: $\Delta E_g$=(constant of proportionality)×(distance between carbon atoms), which estimates a band gap $\Delta E_g$ based on the distance between carbon atoms and which is stored in the knowledge base 22. Further, from the band gap calculated by the property-simulation device 12 and stored in the data base 21 and that calculated using the empirical equation stored in the knowledge base 22, the band gap of another periodically structured material can be inferred by the inference system 23. The results of the inference are, as required, shown on the display device 13 through the control means 14. In this way, the development system simulates the properties of transpolyacetylene, designs the target trans-polyacetylene, retrieves the preparation method therefor using the data base 21, selects the optimal preparation method using the knowledge base 22, and prepares the target base transpolyacetylene. In case that trans-polyacetylene is to be prepared based on, for example, a living polymerization method which has not been reported as a method for synthesizing trans-polyacetylene, the inference system 23 infers an appropriate synthesizing process based on the living polymerization method from materials which are analogous to transpolyacetylene and have been reported to be prepared by the living polymerization method. During the synthesis of trans-polyacetylene by the preparation means, the results of evaluation by the evaluation means 41 using the aforementioned evaluation methods are sequentially shown on the display device 13 and fed back to the design knowledge base system 3 to be incorporated into the data base and the knowledge base so as to allow inference on the properties of a material or a novel preparation method. Based on such data, the design system designs again the periodically structured material with higher accuracy, and the calculations are sent to the preparation means so as to prepare the target periodically structured material with higher efficiency and to evaluate the same.

According to the present invention, as has been described, energy bands of a periodically structured material composed of unit cells repeated infinitely, can be found by the steps of:
Schrödinger equation for the periodically structured material with use of a period boundary condition of Born von Karman to find Bloch functions and energy values of the periodically structured material for each wave number vector thereof;
finding an overlap integral represented by $S_{im} = <\psi_i(k_B)|\psi_m(k_A)>$ between two Bloch functions, $\psi_m(k_A)$ and $\psi_i(k_B)$, for two adjacent wave number vectors, $k_A$ and $k_B$;
calculating a band array operation matrix, $$R_{mn} = \sum_i S_{im}^* S_{in};$$

diagonalizing the band array operation matrix, $R_{mn}$; and
finding, from an eigenvalue, $\gamma_p$, and an eigenvector, $U_{np}$ which result from the diagonalization, Bloch functions in a one-to-one relation with the two adjacent wave number vectors, $k_A$ and $k_B$:

$$\Psi_p(k_A) = \sum_m U_{mp}\Psi_m(k_A) \text{ and } \Psi_q(k_B) = \gamma_q^{-1/2} \sum_i \sum_m S_{im} U_{mp} \Psi_i(k_B)$$

and energy bands in a one-to-one relation therewith. Hence, a method for simulating properties of a periodically structured material is realized which is capable of simulating a wider range of property values with higher accuracy than the prior art method and which is applicable to property simulation of such a periodically structured material as a semiconductor, superconductor or a like material.

Further, the system for designing periodically structured material according to the present invention comprises the input means for specifying requisites for and characteristics of a periodically structured material, the property-simulation device for simulating and analyzing property values of the material, the display device for common use for these components, and the control means for controlling each component. Hence, the design system can design a periodically structured material, such as a semiconductor or a superconductor, of desired properties, for example, conductivity when the requisites for and characteristics of the material are specified.

Further, the design knowledge base according to the present invention comprises the aforementioned property-simulation device for simulating and analyzing the properties of a periodically structured material, the data base, the knowledge base, and the inference system. Hence, the design knowledge base can infer the properties, reactivity and the like of a novel material from property values obtained by the property-simulation device and from information or empirical rules on a periodically structured material and can simulate the properties, such as conductivity, of a periodically structured material, for example, a semiconductor or a superconductor.

Further, the design knowledge base system according to the present invention comprises the aforementioned design system, design knowledge base, and interface interconnecting these two components. Hence, the design knowledge base system can simulate and analyze the properties of a novel material with ease if conditions for the material design are inputted thereto.

Still further, the development system according to the present invention comprises preparation and evaluation means, the design knowledge base system, and an interface interconnecting these components. Hence, the development system can prepare a material with property values simulated, evaluate it, and infer, by feeding back the results of the evaluation to the design knowledge base system, the properties of a material and the preparation method therefor. Thus, the development system is capable of efficiently developing a material with property values of high accuracy.

What is claimed is:

1. A knowledge base system for designing a periodically structured material, comprising:
   (A1) a simulation device which simulates property characteristic values of a periodically structured material, comprising:
      (a') means for solving a Schrödinger equation for the periodically structured material with use of a period boundary condition of Born von Karman to find Bloch functions and energy values of the periodically structured material for each wave number vector thereof;
      (b') means for finding an overlap integral, $S_{im}=<\psi_i(k_B)|\psi_m(k_A)>$ and $\psi_i(k_B)$, for two adjacent wave number vectors, $k_A$ and $k_B$;
      (c') means for calculating a band array operation matrix:

$$R_{mn} = \sum_i S_{im}{}^* S_{in};$$

(d') means for diagonalizing the band array operation matrix $R_{mn}$; and
   (e') means for finding, from an eigenvalue, $\gamma_p$, and an eigenvector, $U_{np}$ which result from the diagonalization, Bloch functions in a one-to-one relation with two adjacent wave number vectors, $k_A$ and $k_B$:

$$\Psi_p(k_A) = \sum_m U_{mp} \Psi_m(k_A) \text{ and } \Psi_q(k_B) = \gamma_q^{-1/2} \sum_i \sum_m S_{im} U_{mq} \Psi_i(k_B)$$

such that energy bands are in one-to-one relation with the two adjacent wave number vectors,
   (B1) a data for base storing data output from the simulation device (A1),
   (B2) a knowledge base for storing information on the periodically structured material, and
   (B3) an inference system which infers properties of the periodically structured material on the basis of data from the data base (B1) and from the knowledge base (B2).

2. A knowledge base system for designing a periodically structured material, comprising:
   (A) a design system for designing a periodically structured material,
   (B) a knowledge base for storing the periodically structured material, and
   (C) an interface through which the design system (A) and the design knowledge base (B) are connected to each other,
   wherein said design system (A) comprises:
      (A1) a simulation device which simulates property characteristic values of the periodically structured material, comprising:
         (a') means for solving a Schrödinger equation for the periodically structured material with use of a period boundary condition of Born von Karman to find Bloch functions and energy values of the periodically structured material for each wave number vector thereof;
         (b') means for finding an overlap integral, $S_{im}=<\psi_i(k_B)|\psi_m(k_A)>$, between two Bloch functions, $\psi_m(k_A)$ and $\psi_i(k_B)$, for two adjacent wave number vectors, $k_A$ and $k_B$;
         (c') means for calculating a band array operation matrix:

$$R_{mn} = \sum_i S_{im}{}^* S_{in};$$

(d') means for diagonalizing the band array operation matrix $R_{mn}$; and
         (e') means for finding, from an eigenvalue, $\gamma_p$, and an eigenvector, $U_{np}$ which result from the diagonalization, Bloch functions in a one-to-one relation with two adjacent wave number vectors, $k_A$ and $k_B$:

$$\tilde{\psi}_p(k_A) = \sum_m U_{mp} \psi_m(k_A)$$

and $$\tilde{\psi}_q(k_B) = \gamma_q^{-\frac{1}{2}} \sum_i \sum_m S_{im} U_{mq} \psi_i(k_B)$$

such that energy bands are in a one-to-one relation with the two adjacent wave number vectors,
      (A2) input mans for receiving requisites for and characteristics of the periodically structured material,
      (A3) a display device for displaying data existing in the input (A2) or in the simulation device (A1), and
      (A4) means for controlling data transfer among the input (A2), the simulation device (A1) and the display device (A3),
   wherein said knowledge base (B) comprises
      (B1) a data base storing data output from the simulation device (A1),
      (B2) a knowledge base storing information on the periodically structured material, and
      (B3) an inference system which infers properties of the periodically structured material on the basis of data from the data base (B1) and from the knowledge base (B2).

3. A system for developing a periodically structured material, comprising:
   (A) preparation means for preparing the periodically structured material, (B) evaluation means for evaluating the periodically structured material, (C) a knowledge base system for designing the periodically structured material, and (D) an interface through which the design knowledge base system is connected to the preparation means and to the evaluation means, wherein said knowledge base system (C) comprises:

(C1) a design system for designing the periodically structured material, (C2) a knowledge base for designing the periodically structured material, and (C3) an interface through which the design system (C1) and the knowledge base (C2) are connected to each other, wherein said design system (C1) comprises:

(a1) a simulation device which simulates property characteristic values of the periodically structured material, comprising:

(a') means for solving a Schrödinger equation for the periodically structured material with use of a period boundary condition of Born von Karman to find Bloch functions and energy values of the periodically structured material for each wave number vector thereof;

(b') means for finding an overlap integral, $S_{im} = <\psi_i(k_B)|\psi_m(k_A)>$, between two Bloch functions, $\psi_m(k_A)$ and $\psi_i(k_B)$, for two adjacent wave number vectors, $k_A$ and $k_B$;

(c') means for calculating a band array operation matrix:

$$R_{mn} = \sum_i S_{im} * S_{in};$$

means for diagonalizing the band array operation matrix $R_{mn}$; and (e') means for finding, from an eigenvalue, $\gamma_p$, and an eigenvector, $U_{np}$ which result from the diagonalization, Bloch functions in a one-to-one relation with said two adjacent wave number vectors, $k_A$ and $k_B$:

$$\tilde{\psi}_p(k_A) = \sum_m U_{mp}\psi_m(k_A)$$

and $$\tilde{\psi}_q(k_B) = \gamma_q^{-\frac{1}{2}} \sum_i \sum_m S_{im}U_{mq}\psi_i(k_B)$$

such that energy bands are in a one-to-one relation with the two adjacent wave number vectors, (a2) input means for receiving requisites for and characteristics of the periodically structured material, (a3) a display device displaying data existing in the input means (a2) or in the simulation device (a1), and (a4) means for controlling data transfer among the input means (a2), the simulation device (a1) and the display device (a3), wherein said knowledge base (C2) comprises:

(b1) a data base storing data output from the simulation device (a1), (b2) a storage for storing information on the periodically structured material, and (b3) an inference system which infers properties of the periodically structured material on the basis of data from the data base (b1) and from the storage (b2).

* * * * *